(12) United States Patent
Liu et al.

(10) Patent No.: US 10,234,998 B2
(45) Date of Patent: Mar. 19, 2019

(54) TOUCH DISPLAY PANEL AND MANUFACTURING METHOD THEREOF, TOUCH DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui Province (CN)

(72) Inventors: Bo Liu, Beijing (CN); Long Xia, Beijing (CN); Qinghua Jiang, Beijing (CN); Xiaohe Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 44 days.

(21) Appl. No.: 15/325,415

(22) PCT Filed: Jan. 26, 2016

(86) PCT No.: PCT/CN2016/072141
§ 371 (c)(1),
(2) Date: Jan. 10, 2017

(87) PCT Pub. No.: WO2017/041414
PCT Pub. Date: Mar. 16, 2017

(65) Prior Publication Data
US 2017/0205910 A1     Jul. 20, 2017

(30) Foreign Application Priority Data
Sep. 11, 2015 (CN) .......................... 2015 1 0580391

(51) Int. Cl.
*G06F 3/044* (2006.01)
*G06F 3/041* (2006.01)
(Continued)

(52) U.S. Cl.
CPC ............ *G06F 3/044* (2013.01); *G02F 1/1333* (2013.01); *G06F 3/0412* (2013.01);
(Continued)

(58) Field of Classification Search
CPC ........ G06F 3/044; G06F 3/041; G06F 3/0416; G06F 3/0412; G06F 2203/04103;
(Continued)

(56) References Cited

U.S. PATENT DOCUMENTS 8,052,498 B2 * 11/2011 Chien .................. G06F 3/0412
430/313
8,519,967 B2 * 8/2013 Chien .................. G06F 3/0412
178/18.06
(Continued)

FOREIGN PATENT DOCUMENTS

CN     102243405 A    11/2011
CN     103543544 A    1/2014
(Continued)

OTHER PUBLICATIONS

International Search report with English language translation, dated Jun. 15, 2016, PCT Application No. PCT/CN2016/072141.
(Continued)

*Primary Examiner* — Dismery Mercedes
(74) *Attorney, Agent, or Firm* — Womble Bond Dickinson (US) LLP

(57) ABSTRACT

The touch display panel comprises an array substrate, a color film substrate a touch electrode layer located at a side of the color film substrate away from the array substrate, and a transparent electrically conductive layer between the color
(Continued)

film substrate and the touch electrode layer and insulated from the touch electrode layer. The transparent electrically conductive layer comprises a first area and a second area, a thickness of the transparent electrically conductive layer in the first area is greater than a thickness of the transparent electrically conductive layer in the second area, the transparent electrically conductive layer is suitable for being electrically connected to ground. A projection area of the touch electrode layer on the color film substrate overlaps with a projection area of the transparent electrically conductive layer located in the second area on the color film substrate.

16 Claims, 7 Drawing Sheets

(51) Int. Cl.
    *G02F 1/1333*    (2006.01)
    *C23C 14/08*     (2006.01)
    *C23C 14/58*     (2006.01)
    *H01L 27/32*     (2006.01)
    *H05K 1/02*      (2006.01)

(52) U.S. Cl.
    CPC .......... *G06F 3/0416* (2013.01); *C23C 14/086* (2013.01); *C23C 14/5873* (2013.01); *G02F 1/13338* (2013.01); *G06F 2203/04103* (2013.01); *G06F 2203/04107* (2013.01); *H01L 27/323* (2013.01); *H05K 1/0274* (2013.01); *H05K 2201/0108* (2013.01)

(58) Field of Classification Search
    CPC ....... G06F 2203/04111; G02F 1/13338; G02F 1/133514; G02F 1/133345; G02F 2201/44; H01L 27/323; H01L 27/3244; H01L 51/441; H01L 51/5203; H01L 51/5256; G09G 2300/0426
    See application file for complete search history.

(56) References Cited

U.S. PATENT DOCUMENTS

| 8,553,161 | B2* | 10/2013 | Song | G06F 3/0412 |
| | | | | 349/106 |
| 9,164,306 | B2* | 10/2015 | Lee | G06F 3/041 |
| 9,256,097 | B2* | 2/2016 | Kim | G02F 1/13338 |
| 2009/0096765 | A1* | 4/2009 | Kuo | G02F 1/13338 |
| | | | | 345/174 |
| 2012/0105337 | A1* | 5/2012 | Jun | G06F 3/0412 |
| | | | | 345/173 |
| 2012/0206395 | A1* | 8/2012 | Misaki | G06F 3/0412 |
| | | | | 345/173 |
| 2013/0241869 | A1* | 9/2013 | Kida | G06F 3/044 |
| | | | | 345/174 |
| 2014/0015775 | A1 | 1/2014 | Wu et al. | |
| 2014/0071360 | A1* | 3/2014 | Chang | G06F 3/0412 |
| | | | | 349/12 |
| 2015/0060252 | A1* | 3/2015 | Wang | H03K 17/9622 |
| | | | | 200/5 R |
| 2016/0188070 | A1* | 6/2016 | Ko | G02F 1/13338 |
| | | | | 29/846 |
| 2016/0342259 | A1* | 11/2016 | Xiong | G06F 3/044 |
| 2017/0177129 | A1* | 6/2017 | Li | G06F 3/041 |
| 2017/0185202 | A1 | 6/2017 | Qu | |

FOREIGN PATENT DOCUMENTS

| CN | 103543544 A | 1/2014 |
| CN | 104090675 A | 10/2014 |
| CN | 104536620 A | 4/2015 |
| CN | 104635992 A | 5/2015 |
| CN | 104765181 A | 7/2015 |
| CN | 104765181 A | 7/2015 |
| CN | 105068295 A | 11/2015 |
| JP | 2013069033 A | 4/2013 |
| JP | 2013069033 A | 4/2013 |
| JP | 2014015017 A | 4/2014 |
| WO | WO-2015079816 A1 | 6/2015 |

OTHER PUBLICATIONS

Office Action in Chinese Application No. 201510580391.3 dated Aug. 28, 2017, with English translation.

* cited by examiner

TOUCH DISPLAY PANEL AND MANUFACTURING METHOD THEREOF, TOUCH DISPLAY DEVICE

RELATED APPLICATIONS

The present application is the U.S. national phase entry of PCT/CN2016/072141, with an international filling date of Jan. 26, 2016, which claims the benefit of Chinese Patent Application NO. 201510580391.3, filed on Sep. 11, 2015, the entire disclosure of which is incorporated herein by reference.

FIELD OF THE INVENTION

The present disclosure relates to the field of display technology, particularly to a touch display panel and manufacturing method thereof, as well as a touch display device.

BACKGROUND

With rapid development of the display technology, the touch display panel has extended all over in people's everyday life gradually. Compared to the conventional display that can only provide a display function, a display using the touch display panel can achieve information interaction between a user and a host machine. Hence, the touch display panel may completely or at least partly replace the commonly used input devices so as to enable the existing display to not only display but also perform touch control. At present, the most widely used touch display panel is the capacitive touch display panel. The capacitive touch display panel may be divided into an in-cell type, an on-cell type and an out-cell type based on its relative relationships with the thin film transistor (TFT) substrate and the color film (CF) substrate.

A planar schematic view of the structure of a single-layer on-cell touch display panel in the prior art is as shown in FIG. 1. The sectional schematic view of FIG. 1 along AA1 direction is as shown in FIG. 2. The touch display panel comprises an array substrate 11 and a color film substrate 12 arranged opposite to each other, as well as a sealing agent 13 and a liquid crystal layer (not shown in the figure) located between the array substrate 11 and the color film substrate 12. A touch electrode layer is arranged at a side of the color filter substrate 12 away from the array substrate 11. The touch electrode layer comprises a sensing electrode 14 and a driving electrode 15. It is determined whether the touch display panel is touched by detecting the strength of the signal received by the sensing electrode 14.

As shown in FIG. 2, the driving electrode 15 on the color film substrate 12 generally has a relatively small width, while the width of the sensing electrode 14 is relatively large, hence, from the macroscopic view, the light transmittance and reflectivity in the area 16 where the sensing electrode 14 locates and that in the area 17 where the driving electrode 15 locates differ greatly, such that human eyes may identify the area where the sensing electrode 14 locates and the area where the driving electrode 15 locates, thereby leading to poor blanking.

In addition, since the surface of the color film substrate 12 is provided with the sensing electrode 14 and the driving electrode 15, the static electricity cannot be released generally, in this way, it would result in problems of white display of the touch display panel and being completely visible for the sensing electrode and the driving electrode.

Therefore, the touch display panel in the prior art could suffer from problems of poor blanking and that the static electricity cannot be released.

SUMMARY

Embodiments of the present invention provide a touch display panel and a manufacturing method thereof, as well as a touch display device, for mitigating or avoiding undesirable image vanishing and achieving the purpose of static electricity releasing.

A touch display panel provided by the embodiment of the invention comprises an array substrate and a color film substrate arranged opposite to each other, a touch electrode layer located at a side of the color film substrate away from the array substrate, and a transparent electrically conductive layer between the color film substrate and the touch electrode layer and insulated from the touch electrode layer. The transparent electrically conductive layer comprises a first area and a second area, a thickness of the transparent electrically conductive layer located in the first area is greater than a thickness of the transparent electrically conductive layer located in the second area, the transparent electrically conductive layer is suitable for being electrically connected to ground. A projection area of the touch electrode layer on the color film substrate overlaps with a projection area of the transparent electrically conductive layer located in the second area on the color film substrate. A difference value between the thickness of the transparent electrically conductive layer located in the first area and a sum of a thickness of the touch electrode layer and the thickness of the transparent electrically conductive layer located in the second area is within a preset range.

As the touch display panel provided by the embodiment of the invention comprises a transparent electrically conductive layer that can be electrically connected to ground, when static electricity is generated due to external factors, the generated static electricity may be introduced to ground terminal through the transparent electrically conductive layer, thereby being capable of releasing the static electricity effectively so as to improve the touch quality. In addition, since the projection area of the touch electrode layer on the color film substrate in the touch display panel of embodiments of the invention overlaps with the projection area of the transparent electrically conductive layer located in the second area on the color film substrate, and the difference value between the sum of the thickness of the touch electrode layer and the thickness of the transparent electrically conductive layer located in the second area and the thickness of the transparent electrically conductive layer located in the first area is within a preset range, compared to the touch display panel of the prior art, the difference between the light transmittance and reflectivity of the area where the sensing electrode locates and that of the area where the driving electrode locates is reduced and even eliminated, thereby being capable of mitigating or avoid the problem of poor blanking excellently.

In an embodiment, the color film substrate is provided with a ground lead. The transparent electrically conductive layer is electrically connected with the ground lead.

Alternatively, the color film substrate is provided with a conducting electrode, the transparent electrically conductive layer is electrically connected with the conducting electrode through a connecting line, an electrically conductive sphere is arranged between the color film substrate and the array substrate, and the conducting electrode is connected with a grounded wire on the array substrate through the electrically conductive sphere.

In another embodiment, the sum of the thickness of the touch electrode layer and the thickness of the transparent electrically conductive layer located in the second area is equal to the thickness of the transparent electrically conductive layer located in the first area.

In another embodiment, an insulating layer is arranged between the transparent electrically conductive layer and the touch electrode layer. The transparent electrically conductive layer and the touch electrode layer are insulated from each other through the insulating layer.

In some embodiments, materials of the transparent electrically conductive layer and the touch electrode layer are same.

Embodiments of the present invention further provide a touch display device. The touch display device can comprise a touch display panel described in any of the above embodiments.

Embodiments of the present invention further provide a method of manufacturing a touch display panel, comprising manufacturing an array substrate and a color film substrate. The method further comprises:

manufacturing a transparent electrically conductive layer at a side of the color film substrate away from the array substrate through a patterning process, the transparent electrically conductive layer comprising a first area and a second area, a thickness of the transparent electrically conductive layer located in the first area being greater than a thickness of the transparent electrically conductive layer located in the second area, and the transparent electrically conductive layer suitable for being electrically connected to ground;

manufacturing an insulating layer on the transparent electrically conductive layer through a patterning process;

manufacturing a touch electrode layer on the insulating layer through a patterning process, a projection area of the touch electrode layer on the color film substrate overlapping with a projection area of the transparent electrically conductive layer located in the second area on the color film substrate; a difference value between the thickness of the transparent electrically conductive layer located in the first area and a sum of a thickness of the touch electrode layer and the thickness of the transparent electrically conductive layer located in the second area being within a preset range.

In an embodiment, the step of manufacturing a transparent electrically conductive layer at a side of the color film substrate away from the array substrate through a patterning process may comprise the following steps:

depositing a transparent electrically conductive film at the side of the color film substrate away from the array substrate;

coating photoresist on the transparent electrically conductive film, performing exposure and development through a mask plate to form a photoresist complete removal area, a photoresist partial removal area and a photoresist complete reserve area, wherein the photoresist complete reserve area corresponds to an area where a transparent electrically conductive layer of the first area has to be formed, the photoresist partial removal area corresponds to an area where a transparent electrically conductive layer of the second area has to be formed, the photoresist complete removal area corresponds to other areas;

etching the photoresist complete removal area, the photoresist partial removal area and the photoresist complete reserve area, to form the transparent electrically conductive layer of the first area and the transparent electrically conductive layer of the second area.

In some embodiments, the mask plate can be a half tone or gray tone mask plate.

In another embodiment, the step of etching the photoresist complete removal area, the photoresist partial removal area and the photoresist complete reserve area, to form the transparent electrically conductive layer of the first area and the transparent electrically conductive layer of the second area may comprise the following steps:

removing the transparent electrically conductive film of the photoresist complete removal area through a first etching;

removing the photoresist of the photoresist partial removal area, and removing part of the transparent electrically conductive film of the photoresist partial removal area through a second etching, so as to form the transparent electrically conducive layer of the second area;

removing the remainder photoresist to form the transparent electrically conductive layer of the first area.

DETAILED DESCRIPTION OF EMBODIMENTS

Figure 1:
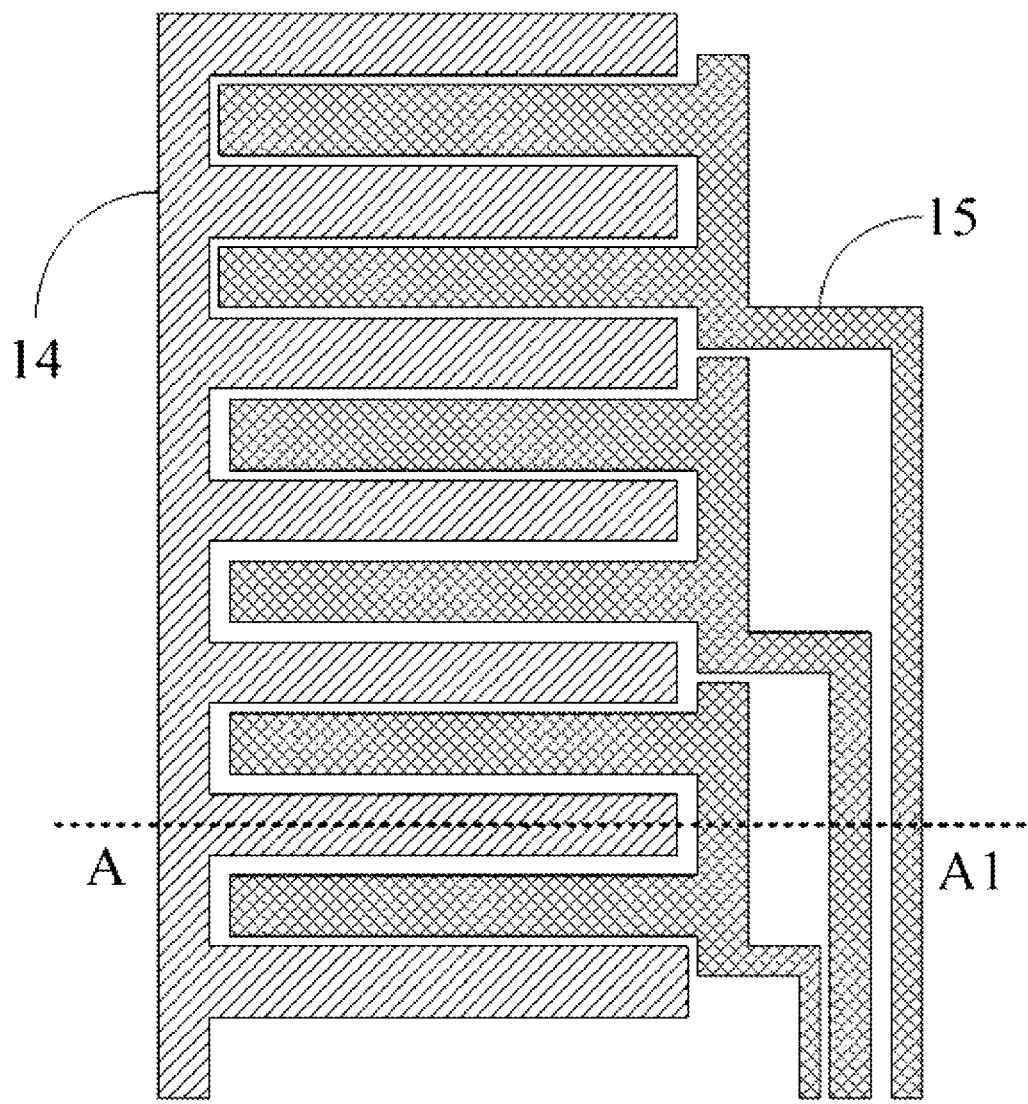
FIG. 1 is a planar schematic view of a structure of a touch display panel in the prior art.
Figure 2:
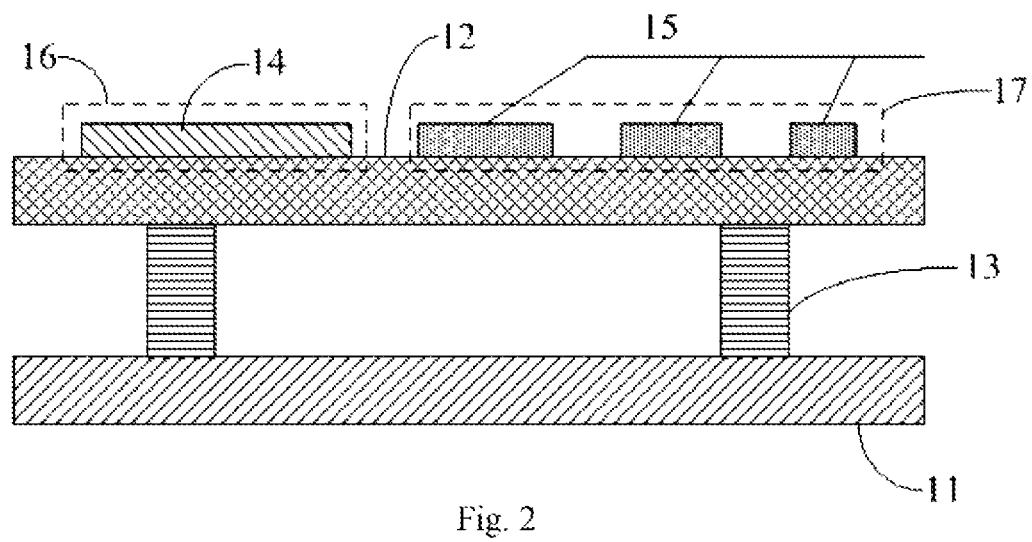
FIG. 2 is a sectional view of a touch display panel in the prior art.

Embodiments of the present invention provide a touch display panel and a manufacturing method thereof, as well as a touch display device, for mitigating or avoiding the problem of poor blanking and achieving the purpose of releasing static electricity.

In order to enable the objective, the technical solutions and advantages of the present disclosure more clearly, embodiments of the invention will be described in more details with reference to the drawings next. Apparently, the embodiments described are only a part of rather than all the embodiments of the invention. All other embodiments obtained by the ordinary skilled person in the art based on the embodiments described herein without paying any creative effort belong to the protection scope of the invention.

Next, the touch display panel and the manufacturing method thereof provided by embodiments of the invention will be introduced specifically with reference to the drawings.

The thickness of the film layer and the area size and shape shown in the drawings do not reflect the real proportions of the film layers, which only aims to illustrate embodiments of the invention.

Figure 3:
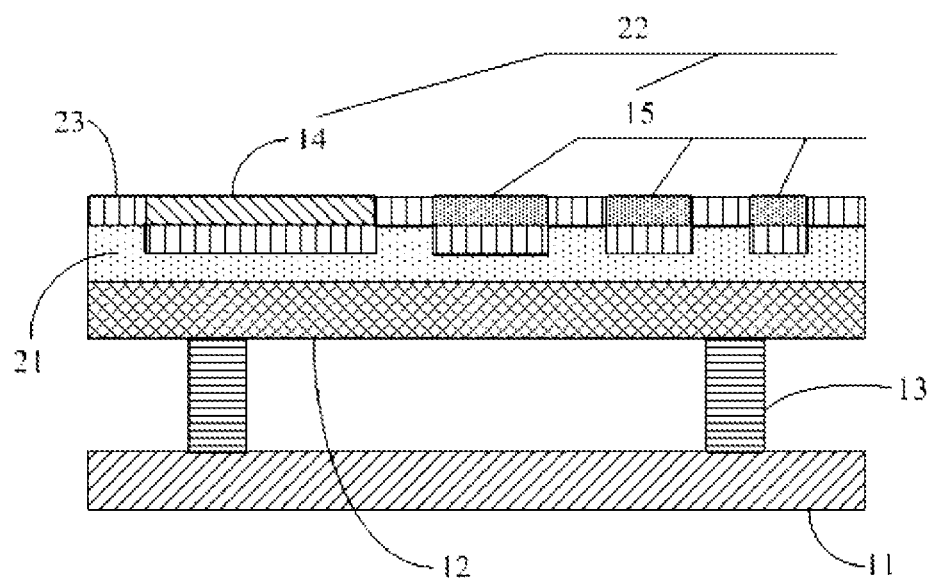
FIG. 3 is a schematic sectional view of a touch display panel provided by an embodiment of the invention.

As shown in FIG. 3, an embodiment of the invention provides a touch display panel, comprising an array substrate 11 and a color film substrate 12 arranged opposite to each other, as well as a touch electrode layer 22 located at a side of the color film substrate 12 away from the array substrate 11. The touch display panel provided by this embodiment further comprises a transparent electrically conductive layer 21 between the color film substrate 12 and the touch electrode layer 22 and insulated from the touch electrode layer 22.

The transparent electrically conductive layer 21 comprises a first area and a second area. The thickness of the transparent electrically conductive layer 21 in the first area is greater than the thickness of the transparent electrically conductive layer 21 in the second area. The transparent electrically conductive layer 21 may be electrically grounded.

The projection area of the touch electrode layer 22 on the color film substrate 12 overlaps with the projection area of the transparent electrically conductive layer 21 located in the second area on the color film substrate. The difference between the sum of the thickness of the touch electrode layer 22 and the thickness of the transparent electrically conductive layer 21 in the second area and the thickness of the transparent electrically conductive layer 21 in the first area is within a preset range.

As shown in FIG. 3, the embodiment of the invention arranges an insulating layer 23 between the transparent electrically conductive layer 21 and the touch electrode layer 22. The transparent electrically conductive layer 21 and the touch electrode layer 22 are insulated from each other through the insulating layer 23. In specific implementation, the insulating layer 23 in this embodiment of the invention may be a single layer film of silicon oxide (SiO2) or silicon nitrogen (SiN), or a composite film of silicon oxide and silicon nitrogen. It can also be a transparent organic insulating film. The embodiment of the invention will not limit the material of the insulating layer 23 specifically.

The touch electrode layer 22 in the embodiment of the invention comprises a sensing electrode 14 and a driving electrode 15. The specific position design for the sensing electrode 14 and the driving electrode 15, and the processes of receiving and detecting the touch signal for the sensing electrode 14 and the driving electrode 15 can be the same as the prior art, which will not be repeated herein.

In an embodiment of the invention, the transparent electrically conductive layer 21 may be a single layer film of tin indium oxide (ITO) or indium zinc oxide (IZO), or a composite film of ITO and IZO. Certainly, in an actual production process, the transparent electrically conductive layer 21 may also be a transparent electrically conductive film of other types. This embodiment does not limit the material of the transparent electrically conductive layer 21.

In the embodiment of the invention, the touch electrode layer 22 may be a single layer film of tin indium oxide (ITO) or indium zinc oxide (IZO), or a composite film of ITO and IZO. Certainly, in an actual production process, the touch electrode layer 22 can also be a transparent electrically conductive film of other types. The specific embodiment of the invention does not limit the material of the touch electrode layer 22 specifically. In one embodiment, the materials of the transparent electrically conductive layer 21 and the touch electrode layer 22 are same.

Figure 4:
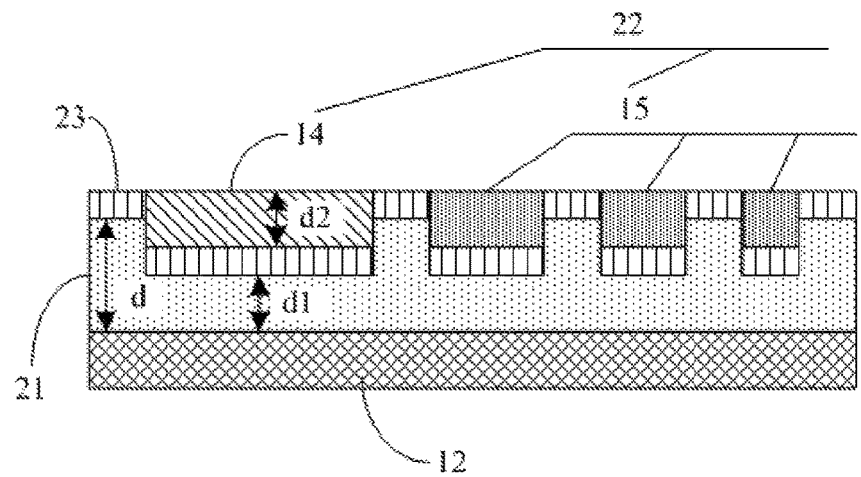
FIG. 4 illustrates a thickness relationship between a transparent electrode layer and a touch electrode layer in a touch display panel provided by an embodiment of the invention.

In another embodiment, as shown in FIG. 4, the sum of the thickness d2 of the touch electrode layer 22 and the thickness d1 of the transparent electrically conductive layer 21 located in the second area can be equal to the thickness d of the transparent electrically conductive layer 21 located in the first area, i.e., d=d1+d2.

From FIG. 4 it can be seen that, the transparent electrically conductive material constituted by the transparent electrically conductive layer 21 and the touch electrode layer 22 may cover the whole color film substrate 12, and this transparent electrically conductive material constituted by the transparent electrically conductive layer 21 and the touch electrode layer 22 has a roughly uniform thickness on the color film substrate 12. Hence, compared to the touch display panel in the prior art, for the touch display pane provided in this embodiment, the difference between the light transmittance and reflectivity of the area where the sensing electrode 14 locates and that of the area where the driving electrode 15 locates is reduced and even eliminated, thereby being capable of mitigating or avoiding poor blanking excellently. Of course, a certain difference value can be allowed between the thickness d of the transparent electrically conductive layer 21 located in the first area and the sum of the thickness d2 of the touch electrode layer 22 and the thickness d1 of the transparent electrically conductive layer 21 located in the second area, and they are not necessarily required to be absolutely equal. For example, in an embodiment, the problem of poor blanking may be mitigated to some extent in practice as long as the absolute value of the difference between (d1+d2) and d is maintained within 5% of the value of (d1+d2) or d.

Figure 5:
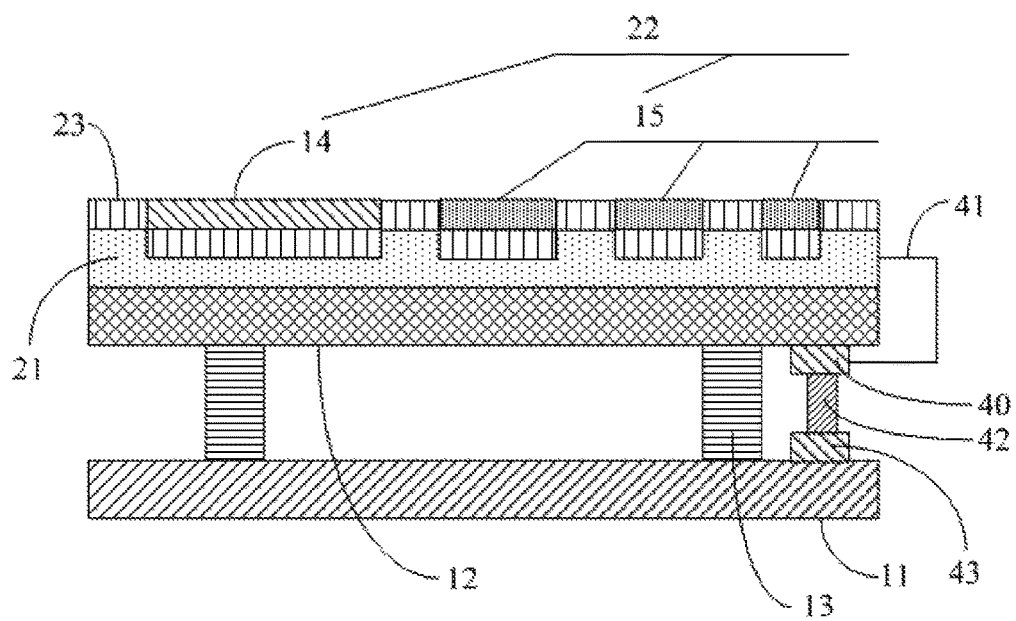
FIG. 5 illustrates the grounding manner for a transparent electrode layer in a touch display panel provided by an embodiment of the invention.

As shown in FIG. 5, in another embodiment, the color film substrate 12 is provided with a conducting electrode 40. The transparent electrically conductive layer 21 is electrically connected with the conducting electrode 40 through a connecting line 41. In the embodiment as shown in FIG. 5, an electrically conductive sphere 42 is arranged between the color film substrate 12 and the array substrate 11. The conducting electrode 40 is connected with a grounded wire 43 on the array substrate 11 through the electrically conductive sphere 42. In an embodiment, the electrically conductive sphere 42 can be an electrically conductive gold sphere.

In this way, when static electricity is generated on the color film substrate due to external factors such as tearing off a protective film, as the transparent electrically conductive layer 21 in the embodiment of the invention may be electrically connected to the ground, the static electricity generated can be led into the ground terminal through the transparent electrically conductive layer 21, thereby being capable of releasing the static electricity effectively and improving the touch characters.

In other embodiments, a ground lead can be arranged on the color film substrate 12. The transparent electrically conductive layer 21 may be electrically connected with the ground lead, thereby electrically connecting the transparent electrically conductive layer 21 to the ground. Certainly, in actual production process, the transparent electrically conductive layer of the specific embodiment of the invention can also be connected to the ground in other manners, which will not be repeated herein.

Another embodiment of the present invention further provides a touch display device. The touch display device comprises the touch display panel provided by any of the above embodiments of the invention. The touch display device could be a display device such as a liquid crystal panel, a liquid crystal display, a liquid crystal television, an organic light emitting diode (OLED) panel, an OLED display, an OLED television or electronic paper.

Figure 6:
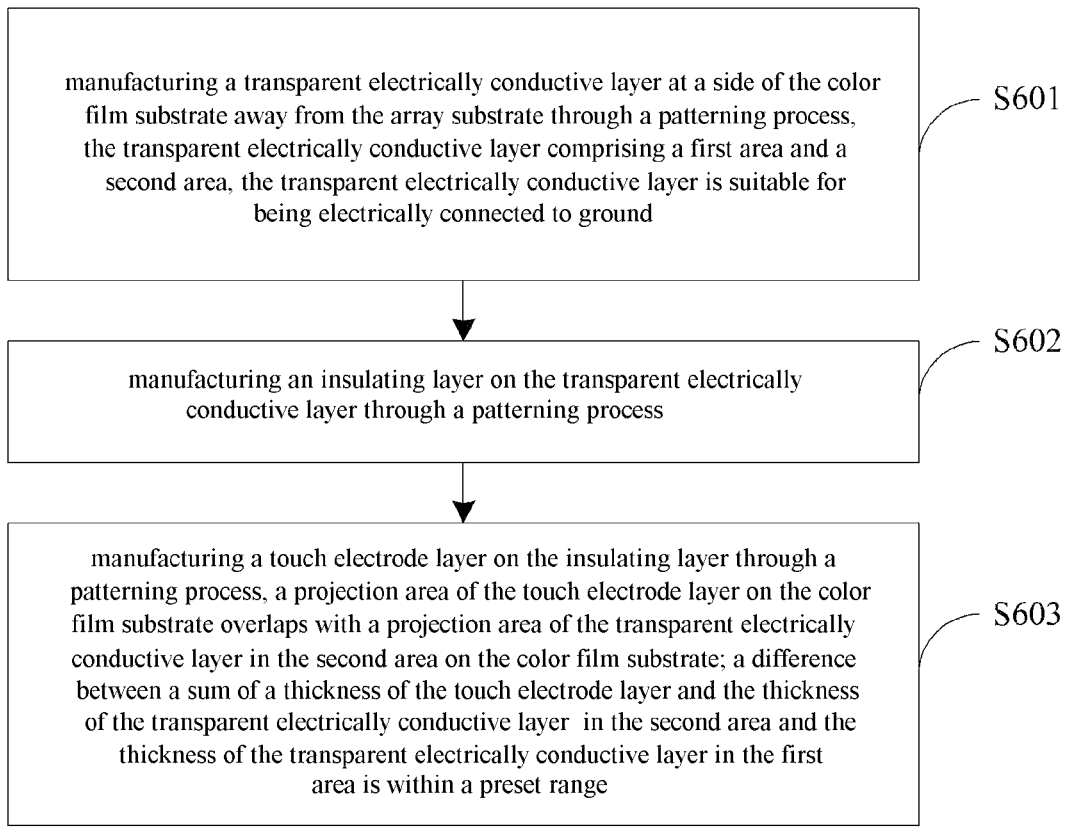
FIG. 6 is a flow chart of a method of manufacturing a touch display panel provided by an embodiment of the invention.

As shown in FIG. 6, a further embodiment of the present invention provides a method of manufacturing a touch display panel, comprising manufacturing an array substrate and a color film substrate. The method may further comprise the following steps:

S601, manufacturing a transparent electrically conductive layer at a side of the color film substrate away from the array substrate through a patterning process, the transparent electrically conductive layer comprising a first area and a second area, a thickness of the transparent electrically conductive layer located in the first area is greater than a thickness of the transparent electrically conductive layer located in the second area. The transparent electrically conductive layer is suitable for being electrically connected to the ground;

S602, manufacturing an insulating layer on the transparent electrically conductive layer through a patterning process;

S603, manufacturing a touch electrode layer on the insulating layer through a patterning process, a projection area of the touch electrode layer on the color film substrate overlaps with a projection area of the transparent electrically conductive layer located in the second area on the color film substrate. A difference between the thickness of the transparent electrically conductive layer located in the first area and a sum of a thickness of the touch electrode layer and the thickness of the transparent electrically conductive layer located in the second area is within a preset range.

The method of manufacturing the array substrate and the color film substrate in the embodiment of the invention may be same as the prior art, which will not be repeated here.

Figure 7:
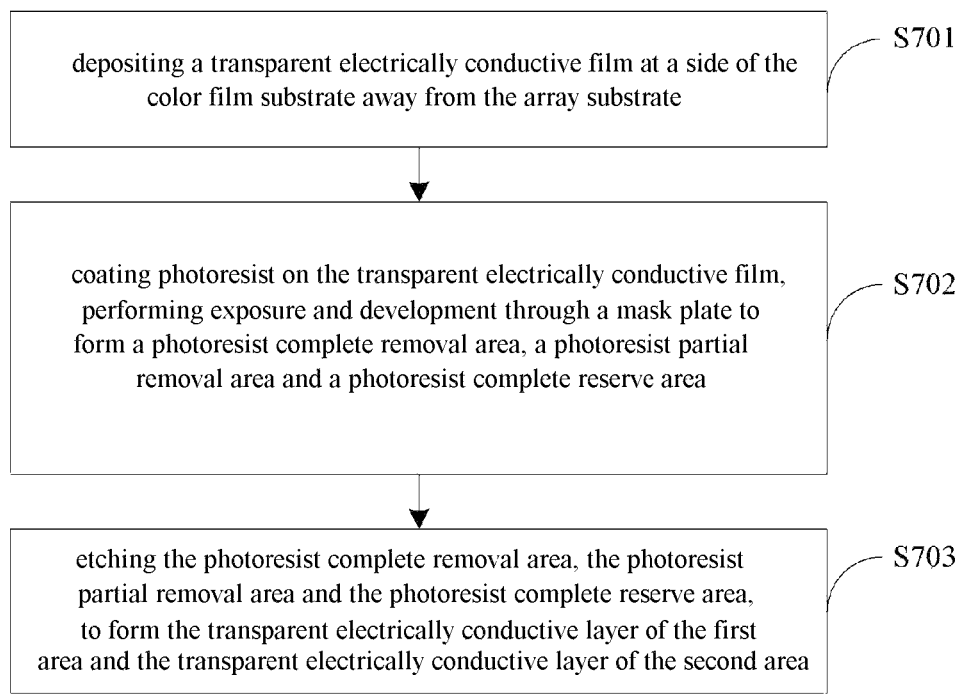
FIG. 7 is a flow chart of a method of manufacturing a transparent electrode layer provided by an embodiment of the invention.

As shown in FIG. 7, in an embodiment, the step of manufacturing a transparent electrically conductive layer at a side of the color film substrate away from the array substrate through a patterning process can comprise the following steps:

S701, depositing a transparent electrically conductive film at a side of the color film substrate away from the array substrate;

S702, coating photoresist on the transparent electrically conductive film, performing exposure and development through a mask plate to form a photoresist complete removal area, a photoresist partial removal area and a photoresist complete reserve area, the photoresist complete reserve area corresponding to an area where a transparent electrically conductive layer of a first area has to be formed, the photoresist partial removal area corresponding to an area where a transparent electrically conductive layer of a second area has to be formed, the photoresist complete removal area corresponding to other areas. It should be understood that the other areas mentioned herein refer to the remainder areas in the photoresist layer after the photoresist partial removal area and the photoresist reserve area are excluded.

S703, etching the photoresist complete removal area, the photoresist partial removal area and the photoresist complete reserve area, to form the transparent electrically conductive layer of the first area and the transparent electrically conductive layer of the second area.

Figure 8:
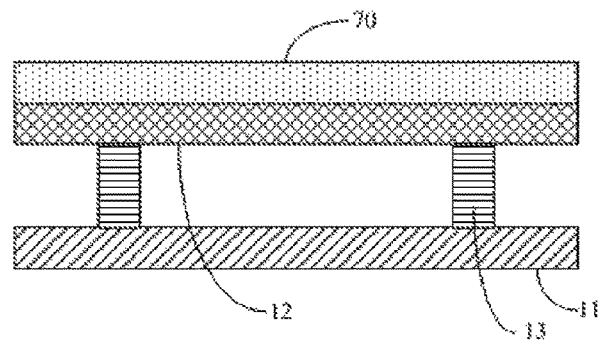
FIG. 8-FIG. 11 are schematic sectional views of touch display panel in different phases of manufacturing process provided by embodiments of the invention.

As shown in FIG. 8, in an embodiment, a layer of transparent electrically conductive film 70 is deposited on a side of the color film substrate 12 away from the array substrate 11 firstly. The depositing method for the transparent electrically conductive film 70 comprises methods such as evaporating, magnetron sputtering etc. The deposited transparent electrically conductive film 70 may be a single layer film of ITO or IZO. The material of the transparent electrically conductive film and the depositing manner of the transparent electrically conductive film are not limited to this specific embodiment of the present invention.

Next, photoresist is coated on the transparent electrically conductive film 70. Exposure and development are performed through a mask plate, so as to form the photoresist complete removal area, the photoresist partial removal area and the photoresist complete reserve area. In the embodiment, the exposure can be performed through a half tone or gray tone mask plate.

Figure 9:
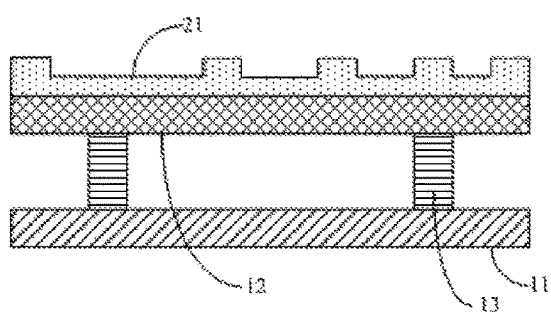

Subsequently, the transparent electrically conductive film of the photoresist complete removal area is removed through a first etching, and then the photoresist of the photoresist partial removal area is removed. Part of the transparent electrically conductive film of the photoresist partial removal area is removed through a second etching, so as to form the transparent electrically conductive layer of the second area. Finally, the remainder photoresist is removed to form the transparent electrically conductive layer of the first area. The transparent electrically conductive layer of the second area and the transparent electrically conductive layer of the first area form the transparent electrically conductive layer 21 of the specific embodiment of the invention, as shown in FIG. 9 (the photoresist complete removal area is not shown in the figure).

In an embodiment, the first etching and the second etching may comprise wet-etching. In an embodiment of the present invention, the photoresist for the photoresist partial removal area may be removed through the ashing process, and the remainder photoresist may be removed through a stripping method.

Figure 10:
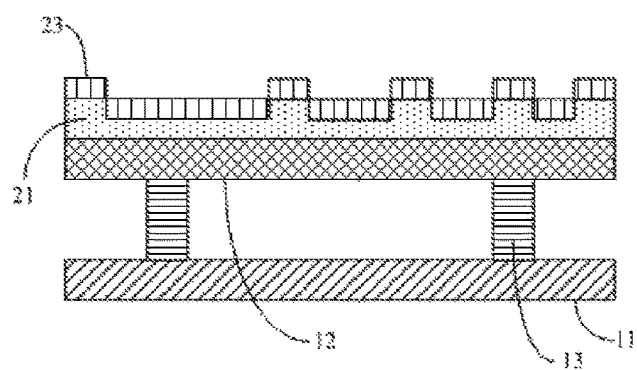

Then, as shown in FIG. 10, the insulating layer 23 is manufactured on the transparent electrically conductive layer 21 through a patterning process. This patterning process may involve part or all processes of coating, exposing, developing, etching and removing the photoresist. The specific process of manufacturing the insulating layer 23 in the embodiment of the invention can be same as the method in the prior art, which will not be repeated herein.

Figure 11:
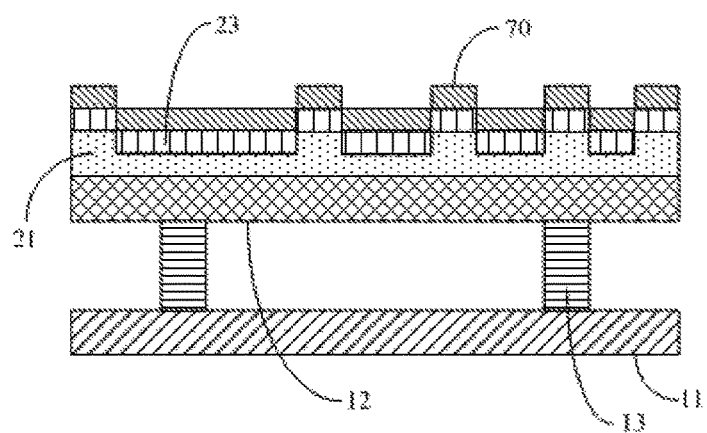

Subsequently, as shown in FIG. 11, a layer of transparent electrically conductive film is deposited on the insulating layer 23. Here, the material of the deposited transparent electrically conductive film can be same as the material that forms the transparent electrically conductive layer 21. In this way, it would be more convenient and simple in selection of the material, requirement on environment in the specific manufacturing process, and adjustment of specific parameters of the manufacturing process.

Thereafter, photoresist is coated on the transparent electrically conductive film, and exposing, developing and etching are performed to form the touch electrode layer 22 of the embodiment of the invention, as shown in FIG. 3. The specific method of manufacturing the touch electrode layer 22 in this embodiment can be same as the prior art, which will not be repeated here.

To sum up, the embodiments of the invention provide a touch display panel and a manufacturing method thereof, as well as a touch display device. The touch display panel comprises an array substrate and a color film substrate arranged opposite to each other, as well as a touch electrode layer located at a side of the color film substrate away from the array substrate, and may further comprise a transparent electrically conductive layer arranged between the color film substrate and the touch electrode layer and insulated from the touch electrode layer. The transparent electrically conductive layer comprises a first area and a second area. A thickness of the transparent electrically conductive layer located in the first area is greater than a thickness of the transparent electrically conductive layer located in the second area. The transparent electrically conductive layer is suitable for being electrically connected to the ground. A projection area of the touch electrode layer on the color film substrate overlaps with a projection area of the transparent electrically conductive layer located in the second area on the color film substrate. A difference value between a sum of a thickness of the touch electrode layer and the thickness of the transparent electrically conductive layer located in the second area and the thickness of the transparent electrically conductive layer located in the first area is within a preset range. Because the touch display panel provided by the embodiments of the present invention comprises a transparent electrically conductive layer suitable for being electrically connected to the ground, when static electricity is generated due to external factors, the generated static electricity may be introduced to the ground terminal through the transparent electrically conductive layer, thereby being capable of releasing the static electricity effectively so as to improve the touch quality. In addition, since the projection area of the touch electrode layer on the color film substrate in the touch display panel of the embodiments of the invention overlaps with the projection area of the transparent electrically conductive layer located in the second area on the color film substrate, and the difference value between the thickness of the transparent electrically conductive layer located in the first area and the sum of the thickness of the touch electrode layer and the thickness of the transparent electrically conductive layer located in the second area is within a preset range, compared to the touch display panel of the prior art, the difference between the light transmittance and reflectivity of the area where the sensing electrode of the touch display panel locates and that of the area where the driving electrode locates is reduced and even eliminated, thereby being capable of mitigating or avoid the problem of poor blanking.

Apparently, the skilled person in the art can make various amendments and modifications to the present disclosure without departing from the spirit and the scope of the invention. In this way, provided that these amendments and modifications of the present disclosure belong to the scopes of the claims of the invention and the equivalent technologies thereof, the present invention also intends to encompass these amendments and modifications.

The invention claimed is:

1. A touch display panel, comprising:
   an array substrate and a color film substrate arranged opposite to each other,
   a touch electrode layer located at a side of the color film substrate away from the array substrate, and
   a transparent electrically conductive layer between the color film substrate and the touch electrode layer and insulated from the touch electrode layer,
   wherein the transparent electrically conductive layer comprises a first area and a second area, a thickness of the transparent electrically conductive layer located in the first area is greater than a thickness of the transparent electrically conductive layer located in the second area,
   the transparent electrically conductive layer is suitable for being electrically connected to ground,
   wherein a projection area of the touch electrode layer on the color film substrate overlaps with a projection area of the transparent electrically conductive layer located in the second area on the color film substrate,
   wherein the thickness of the transparent electrically conductive layer located in the first area is substantially equal to a sum of a thickness of the touch electrode layer and the thickness of the transparent electrically conductive layer located in the second area.

2. The touch display panel according to claim 1, wherein the color film substrate is provided with a ground lead, the transparent electrically conductive layer is electrically connected with the ground lead.

3. The touch display panel according to claim 2, wherein the sum of the thickness of the touch electrode layer and the thickness of the transparent electrically conductive layer located in the second area is equal to the thickness of the transparent electrically conductive layer located in the first area.

4. The touch display panel according to claim 3, wherein an insulating layer is arranged between the transparent electrically conductive layer and the touch electrode layer, the transparent electrically conductive layer and the touch electrode layer are insulated from each other through the insulating layer.

5. The touch display panel according to claim 4, wherein materials of the transparent electrically conductive layer and the touch electrode layer are same.

6. The touch display panel according to claim 1, wherein the color film substrate is provided with a conducting electrode, the transparent electrically conductive layer is electrically connected with the conducting electrode through a connecting line, wherein an electrically conductive sphere is arranged between the color film substrate and the array substrate, and the conducting electrode is connected with a grounded wire on the array substrate through the electrically conductive sphere.

7. A touch display device, comprising a touch display panel, the touch display panel comprising:
   an array substrate and a color film substrate arranged opposite to each other,
   a touch electrode layer located at a side of the color film substrate away from the array substrate, and
   a transparent electrically conductive layer between the color film substrate and the touch electrode layer and insulated from the touch electrode layer,
   wherein the transparent electrically conductive layer comprises a first area and a second area, a thickness of the transparent electrically conductive layer located in the first area is greater than a thickness of the transparent electrically conductive layer located in the second area,
   the transparent electrically conductive layer is suitable for being electrically connected to ground,
   wherein a projection area of the touch electrode layer on the color film substrate overlaps with a projection area of the transparent electrically conductive layer located in the second area on the color film substrate,
   wherein the thickness of the transparent electrically conductive layer located in the first area is substantially equal to a sum of a thickness of the touch electrode layer and the thickness of the transparent electrically conductive layer located in the second area.

8. The touch display device according to claim 7, wherein the color film substrate is provided with a ground lead, the transparent electrically conductive layer is electrically connected with the ground lead.

9. The touch display device according to claim 8, wherein the sum of the thickness of the touch electrode layer and the thickness of the transparent electrically conductive layer located in the second area is equal to the thickness of the transparent electrically conductive layer located in the first area.

10. The touch display device according to claim 9, wherein an insulating layer is arranged between the transparent electrically conductive layer and the touch electrode layer, the transparent electrically conductive layer and the touch electrode layer are insulated from each other through the insulating layer.

11. The touch display device according to claim 10, wherein materials of the transparent electrically conductive layer and the touch electrode layer are same.

12. The touch display device according to claim 7, wherein the color film substrate is provided with a conducting electrode, the transparent electrically conductive layer is electrically connected with the conducting electrode through a connecting line, wherein an electrically conductive sphere is arranged between the color film substrate and the array substrate, and the conducting electrode is connected with a grounded wire on the array substrate through the electrically conductive sphere.

13. A method of manufacturing a touch display panel, comprising manufacturing an array substrate and a color film substrate, wherein the method further comprises:
    manufacturing a transparent electrically conductive layer at a side of the color film substrate away from the array substrate through a patterning process, the transparent electrically conductive layer comprising a first area and a second area, a thickness of the transparent electrically conductive layer located in the first area being greater than a thickness of the transparent electrically conductive layer located in the second area, and the transparent electrically conductive layer suitable for being electrically connected to ground;
    manufacturing an insulating layer on the transparent electrically conductive layer through a patterning process;
    manufacturing a touch electrode layer on the insulating layer through a patterning process, a projection area of the touch electrode layer on the color film substrate overlapping with a projection area of the transparent electrically conductive layer located in the second area on the color film substrate, the thickness of the transparent electrically conductive layer located in the first area being substantially equal to a sum of a thickness of the touch electrode layer and the thickness of the transparent electrically conductive layer located in the second area.

14. The method according to claim 13, wherein the step of manufacturing a transparent electrically conductive layer at a side of the color film substrate away from the array substrate through a patterning process comprises:
    depositing a transparent electrically conductive film at the side of the color film substrate away from the array substrate;
    coating photoresist on the transparent electrically conductive film, performing exposure and development through a mask plate to form a photoresist complete removal area, a photoresist partial removal area and a photoresist complete reserve area, wherein the photoresist complete reserve area corresponds to an area where a transparent electrically conductive layer of the first area has to be formed, the photoresist partial removal area corresponds to an area where a transparent electrically conductive layer of the second area has to be formed, the photoresist complete removal area corresponds to other areas;
    etching the photoresist complete removal area, the photoresist partial removal area and the photoresist complete reserve area, to form the transparent electrically conductive layer of the first area and the transparent electrically conductive layer of the second area.

15. The method according to claim 14, wherein the mask plate is a half tone or gray tone mask plate.

16. The method according to claim 15, wherein the step of etching the photoresist complete removal area, the photoresist partial removal area and the photoresist complete reserve area, to form the transparent electrically conductive layer of the first area and the transparent electrically conductive layer of the second area comprises:
    removing the transparent electrically conductive film of the photoresist complete removal area through a first etching;
    removing the photoresist of the photoresist partial removal area, and removing part of the transparent electrically conductive film of the photoresist partial removal area through a second etching, so as to form the transparent electrically conducive layer of the second area;
    removing the remainder photoresist to form the transparent electrically conductive layer of the first area.

* * * * *